(12) United States Patent
Yeh et al.

(10) Patent No.: US 8,653,808 B2
(45) Date of Patent: Feb. 18, 2014

(54) METHOD FOR FREQUENCY DETECTION AND DETECTING VARIATION OF FREQUENCY

(75) Inventors: Yun-Hsiang Yeh, Miaoli County (TW); Chang-Sian Chen, Hsin-Chu (TW)

(73) Assignee: Waltop International Corporation, Hsin-Chu (TW)

( * ) Notice: Subject to any disclaimer, the term of this patent is extended or adjusted under 35 U.S.C. 154(b) by 349 days.

(21) Appl. No.: 13/024,236

(22) Filed: Feb. 9, 2011

(65) Prior Publication Data

US 2012/0038370 A1 Feb. 16, 2012

(30) Foreign Application Priority Data

Aug. 12, 2010 (TW) ................. 99126828 A

(51) Int. Cl.
*G01R 23/14* (2006.01)
(52) U.S. Cl.
USPC ...................................... 324/76.41
(58) Field of Classification Search
USPC ........................... 324/76.44, 76.47
See application file for complete search history.

(56) References Cited

U.S. PATENT DOCUMENTS 7,176,907 B2 * 2/2007 Chao et al. ............... 345/179
8,040,158 B2 * 10/2011 Suzuki ..................... 327/41
2007/0262242 A1 * 11/2007 Grandjean et al. ...... 250/214 R

* cited by examiner

*Primary Examiner* — Arleen M Vazquez
*Assistant Examiner* — Feba Pothen
(74) *Attorney, Agent, or Firm* — Stout, Uxa, Buyan & Mullins, LLP

(57) ABSTRACT

Method for frequency detection and detecting variation of frequency is disclosed. The method comprises the following steps. First of all, a pointer is provided over an electromagnetic position detection apparatus, wherein the pointer emits an electromagnetic signal with a frequency $f_1$. Next a base integration signal is generated according to the integration of the electromagnetic signal with the frequency $f_1$ for a current integration period x. Then a current integration signal is generated according to the integration of the electromagnetic signal with the frequency $f_1$ for the current integration period x and a predetermined electromagnetic signal with a predetermined frequency $f_0$ for the predetermined integration period y. Finally, a frequency variation value $\Delta f$ between the frequency $f_1$ and a current frequency $f_c$ is calculated and obtained according to the current integration signal and the base integration signal.

5 Claims, 4 Drawing Sheets

METHOD FOR FREQUENCY DETECTION AND DETECTING VARIATION OF FREQUENCY

CROSS-REFERENCE TO RELATED APPLICATIONS

The entire contents of Taiwan Patent Application No. 099126828, filed on Aug. 12, 2010, from which this application claims priority, are incorporated herein by reference.

BACKGROUND OF THE INVENTION

1. Field of the Invention

The present invention relates to a method for frequency detection and detecting variation of frequency, and more particularly to a method for frequency detection and detecting variation of frequency for an electromagnetic position detection apparatus.

2. Description of Related Art

Electromagnetic position detection apparatus such as a digitizer or a digital tablet includes a detection area comprising a plurality of partially overlapped and parallel arranged along x and y axes antennas or sensor coils on a board or a substrate to receive and detect electromagnetic signals from a pointer such as an electromagnetic pen or a stylus. The antennas or sensor coils in the detection area around the location of the electromagnetic pen or the stylus receive and detect the electromagnetic signals from the electromagnetic pen or the stylus, and the electromagnetic position detection apparatus calculates the coordinates of the electromagnetic pen or the stylus according data including the frequency, amplification, and phase angle of the electromagnetic signals.

The electromagnetic signal detected by the antenna or sensor coil presents as an alternating voltage signal, and is processed by the electromagnetic position detection apparatus through signal amplification, phase detecting and signal conversion from analog to digital, etc. In order to calculate the coordinate of the electromagnetic pen or the stylus via the electromagnetic signal detected by the antenna or sensor coil, the frequency of the electromagnetic signal must be calculated. One of the conventional methods for calculating the frequency of the electromagnetic signal includes sampling the signal in a predetermined number of period/cycle and calculating the period/cycle of the signal by a timer and then converting the period/cycle to the frequency of the signal. However, using the timer to calculate the period/cycle and convert the period/cycle to the frequency has the following drawbacks. The clock speed of the timer must be high enough if the frequency is high or the tiny variation of the frequency will not be detected. Moreover, the number of the period/cycle selected to sample the signal must be large enough, but there will not be enough number of the period/cycle to be selected if the strength of the signal fades particularly when a batteryless electromagnetic pen or stylus is used. FIG. 1 shows a schematic diagram of a conventional method for calculating the variation of frequency of the signals. As shown in FIG. 1, the method includes the step of sampling two different numbers of cycles (2 cycles and 5 cycles) corresponding to two signals with slightly different frequencies respectively and subtracting the common error (such as the time or duration from the beginning shown in FIG. 1). The time of two cycles (time A) is subtracted from the time (time B) of five cycles corresponding to two signals with slightly different frequencies respectively, and the difference between time B and time A is divided by three (the difference between the numbers of cycles) and is very close to the current/present period of the signal. Thus the current/present frequency can be calculated. The feature of this method is that the calculation of the current/present frequency will not be significantly affected when the frequency varies. However, if the value of the variation of frequency is tiny which means that the value of the variation of period is also small, a timer with a very high clock speed must be used for calculating such tiny variation of frequency. For example, if the frequency varies from 375 KHz to 372 KHz, which means that the period varies from 2.666 μsec to 2.688 μsec, the value of the variation of period is only 0.022 μsec which needs a timer with a very high clock speed to calculate. The use of a timer with a very high clock speed will increase the cost. Another conventional method for calculating the variation of frequency of the signal includes the step of comparing phase shift of the signals. However, the phase shift of the signals depends on the hardware used, and large errors may be generated so that only relative difference between frequencies is obtained, not the actual frequency. Furthermore, the error will vary with the strength of the signal which further decreases the accuracy of the calculation of the frequency.

In order to precisely calculate the frequency and the variation of frequency of signal and to solve the above-mentioned drawbacks of the conventional method, the invention provides to a method for frequency detection and detecting variation of frequency for an electromagnetic position detection apparatus to calculate the actual frequency of signal within a shorter/smaller numbers of period/cycle without errors of the calculation of frequency resulting from the hardware used.

SUMMARY OF THE INVENTION

An object of the present invention is to calculate the actual frequency and variation of frequency of signal within a shorter/smaller numbers of period/cycle without being affected by phase shift of signal resulting from different hardwares used, and to minimize errors of the calculation of frequency resulting from the variation of strength of signal.

According to the object, one embodiment of the present invention provides a method for frequency detection and detecting variation of frequency. The method comprises the following steps. First of all, a pointer on an electromagnetic position detection apparatus, the pointer emitting a signal with a frequency $f_1$ to the electromagnetic position detection apparatus is provided. Next a base integration signal is generated according to a current integration period x of the signal with the frequency $f_1$. Then a current integration signal is generated according to the current integration period x and a predetermined integration period y of a predetermined signal with a predetermined frequency $f_0$. Finally, a variation of frequency $\Delta f$ between the predetermined frequency $f_0$ and a current frequency $f_c$ is calculated according to the base integration signal and the current integration signal.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

DESCRIPTION OF THE PREFERRED EMBODIMENT

The detailed description of the present invention will be discussed in the following embodiments, which are not intended to limit the scope of the present invention, and can be adapted for other applications. While drawings are illustrated in detail, it is appreciated that the scale of each component may not be expressly exactly.

Figure 1:
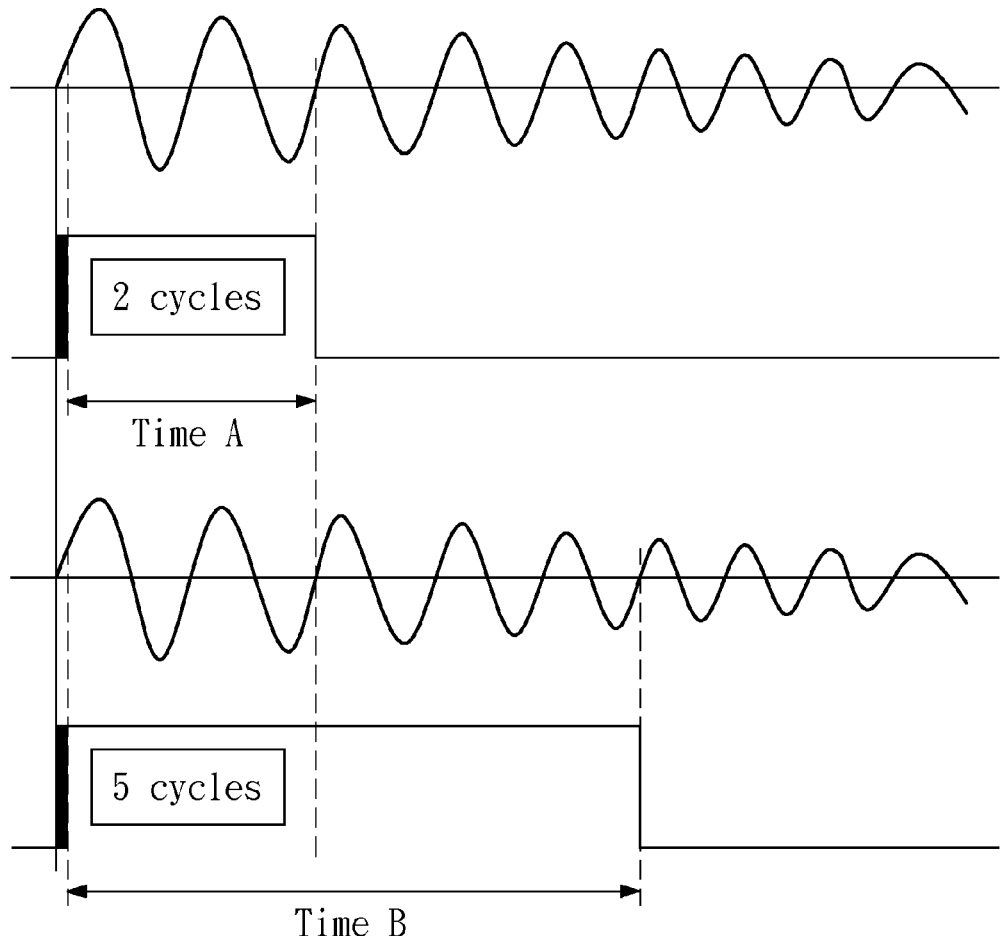
FIG. 1 shows a schematic diagram of a conventional method for calculating the variation of frequency of the signals.
Figure 2:
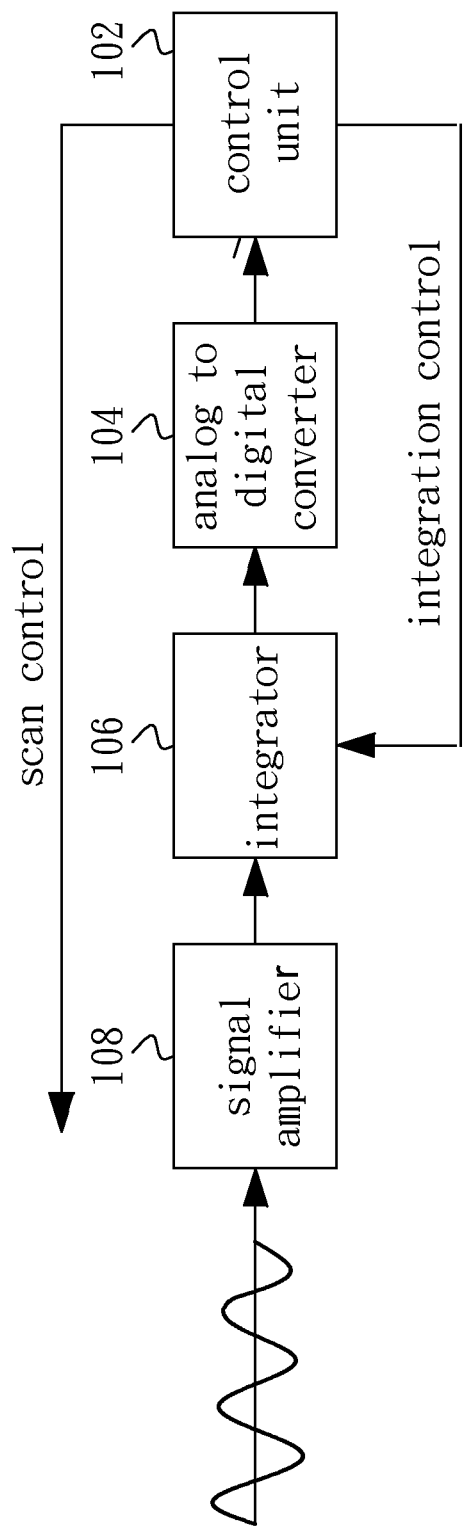
FIG. 2 shows a block diagram of an electromagnetic position detection apparatus according to one embodiment of the invention.

FIG. 2 shows a block diagram of an electromagnetic position detection apparatus according to one embodiment of the invention. The electromagnetic position detection apparatus comprises a control unit 102, an analog to digital converter 104, an integrator 106 and a signal amplifier 108 of a signal detection circuit. The features of the invention disclose a method for frequency detection and detecting variation of frequency for an electromagnetic position detection apparatus, the portions of an electromagnetic position detection apparatus which are not crucial for these features are omitted in the block diagram of the electromagnetic position detection apparatus shown in FIG. 2. For example, the detail features of the signal detection circuit including the signal amplifying and phase detection are not particularly described. The omitted portions of the electromagnetic position detection apparatus can be practiced via any well-known prior art, and one with ordinary skill in the art can make and use the invention based on ordinary level of skill. The electromagnetic position detection apparatus for practicing the invention is not limited to the electromagnetic position detection apparatus shown in FIG. 2. It will be appreciated by those skilled in the art that the various equivalent electromagnetic position detection apparatuses with various modifications may be used to practice the invention without departing from the scope of the present invention, which is intended to be limited solely by the appended claims. The electromagnetic position detection apparatus further comprises an electromagnetic antenna board including a plurality of partially overlapped and parallel arranged along x and y axes antennas or sensor coils on a board or a substrate. The antennas or sensor coils of the electromagnetic antenna board connect to switches controlled by the control unit 102 to switch the sensor coils in order to transmit and receive electromagnetic signals. The electromagnetic position detection apparatus comprises electromagnetic position detection apparatuses used with batteryless pointers or pointers with batteries. If the electromagnetic position detection apparatus is for use with pointers with batteries, the electromagnetic antenna board further comprises power loops or loop coils for transmitting control signals. The power loops can be located around the antennas or sensor coils on the electromagnetic antenna board, but is not limited to this. When the pointers with batteries approach the electromagnetic antenna board, the control unit 102 controls the power loops to transmit control signals to the pointers. The pointers then transmit signals to the electromagnetic antenna board. If the electromagnetic position detection apparatus is for use with batteryless pointers, the control unit 102 controls a signal generating circuit and a selection circuit to switch and transmit signals through the antennas or sensor coils. The signals from the antennas or sensor coils resonate with the resonance circuits of the pointers. The resonance circuits of the pointers transmit signals back to the antennas or sensor coils when the antennas or sensor coils temporarily stop transmitting signals. The signals received by the antennas or sensor coils are processed by the signal amplifier 108 of the signal detection circuit. The signals processed by the signal amplifier 108 are then transmitted to the integrator 106. The signals are then transmitted to the analog to digital converter 104 connecting to the control unit 102. The control unit 102 comprises a micro-controller unit (MCU).

For the electromagnetic position detection apparatus used with batteryless pointers, the control unit 102 controls a signal generating circuit and a selection circuit to switch and transmit signals through the antennas or sensor coils. For the electromagnetic position detection apparatus used with pointers with batteries, the control unit 102 controls the power loops to transmit control signals to the pointers. The pointers then transmit signals to the antennas or sensor coils of the electromagnetic position detection apparatus. The control unit 102 sequentially switches the antennas or sensor coils through a signal generating circuit and a selection circuit to perform a full region scan to substantially locate the positions of the pointers. Then the control unit 102 controls the signal generating circuit and the selection circuit to sequentially switch and select the antennas or sensor coils within a certain region including those sensor coils which receive signals with maximum values to transmit and receive signals to perform a partial region scan. The partial region scan only switches the antennas or sensor coils adjacent the antennas or sensor coils receiving the signals with maximum values to transmit and receive signals. The coordinates of the pointers are located if signals with maximum values are received and the accurate coordinates of the pointers are calculated through further signal processing.

Referring to FIG. 2, when the antennas or sensor coils on the electromagnetic antenna board receive signals from the pointers, the signal detection circuit of the electromagnetic position detection apparatus detects and obtains the amplifications and the phases of the signals. The amplification of the signals is performed by the signal amplifier 108 of the signal detection circuit. The integration of the signals is performed by the integrator 106. The signals from the integrator 106 are then converted from analog signals into digital signals by the analog to digital converter 104 and transmitted to the control unit 102. The control unit 102 locates the antennas or sensor coils which emit the signals and calculates the coordinates of the pointers according to the amplifications, frequency and phase angles of the signals. The control unit 102 passes integration control signal to the integrator 106 to perform the integration of the signals.

Figure 3:
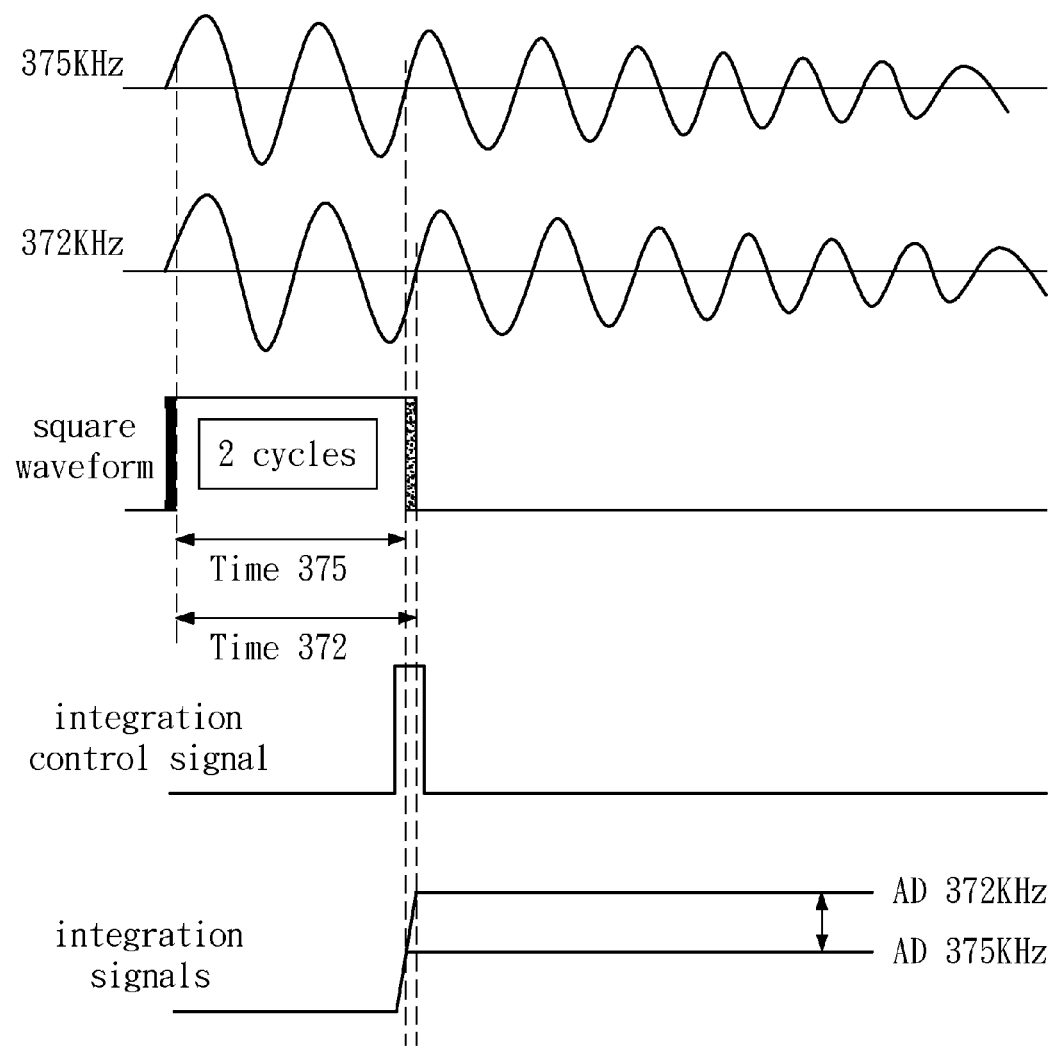
FIG. 3 shows signal waveforms of different frequencies and corresponding square waveforms, integration control signal, and integration signals according to one embodiment of the invention.

FIG. 3 shows signal waveforms of different frequencies and corresponding square waveforms, integration control signal, and integration signals according to one embodiment of the invention. In FIG. 3, signals with respective frequencies 375 KHz and 372 KHz are processed and integrated to form separate integration signals through the integrator or other circuits. Square waveforms corresponding the signal with frequencies 375 KHz and 372 KHz respectively are used for the calculation of variation of frequency. The value of variation of signal frequency is obtained through the calculation of the difference between integration signals AD 375 KHz and AD 372 KHz, wherein two cycles/periods of the signals are selected as shown in FIG. 3. It will be appreciated that the number of the cycle/period selected to calculate the value of variation of frequency of the signal is not limited and can be dynamically adjusted. However, due to error resulting from different hardware used, the values of variation of frequency of the signals calculated by different hardwares may be different since integration signal of one signal formed by different hardwares may be varied.

Figure 4:
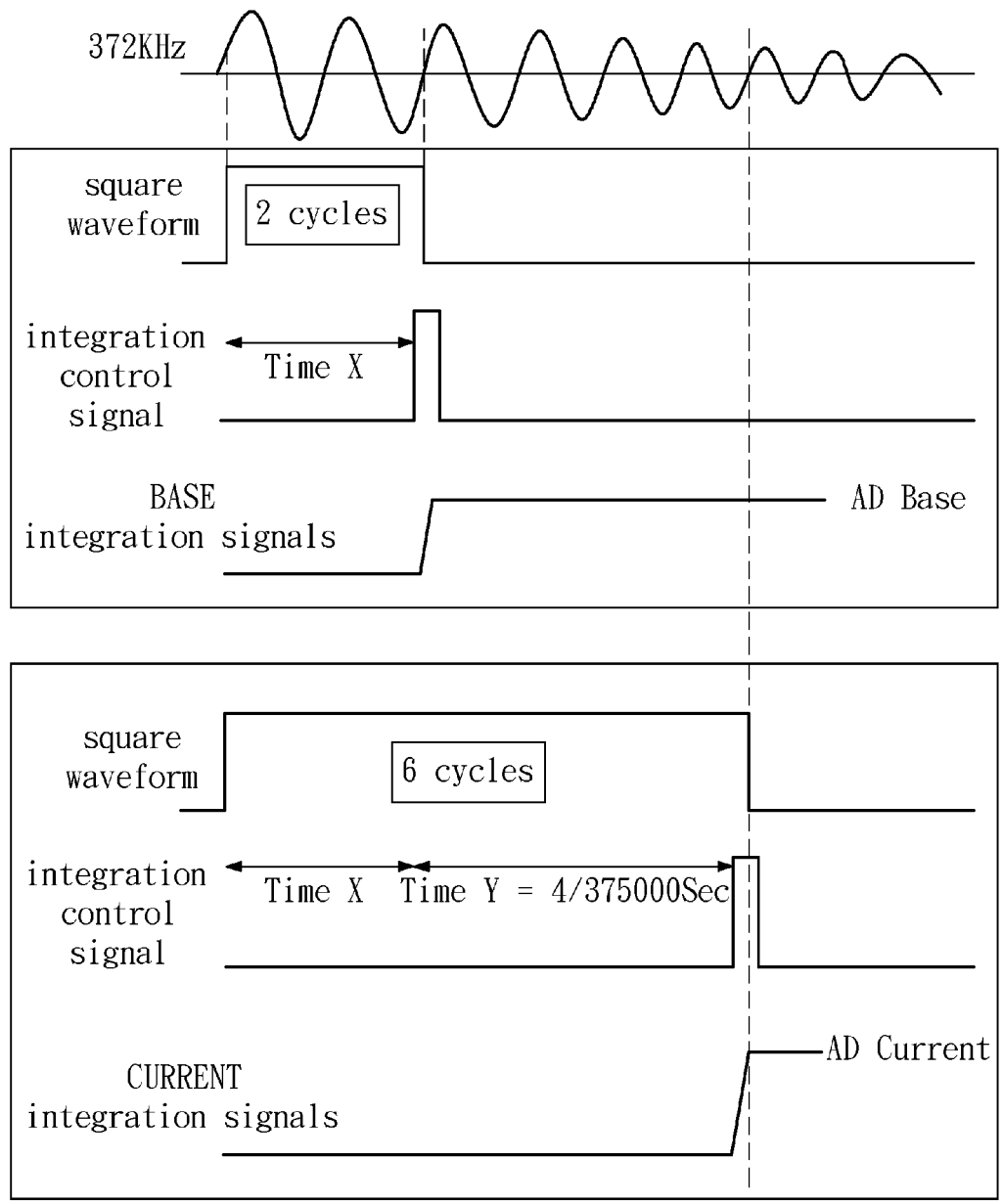
FIG. 4 shows schematic diagrams of a two-stage method for calculating the variation of frequency of the signals according to one embodiment of the invention.

In order to avoid the error and variation of integration signals resulting from different hardware used, a two-stage method is used to calculate the values of variation of frequency of the signals. FIG. 4 shows schematic diagrams of a two-stage method for calculating the variation of frequency of the signals according to one embodiment of the invention. In the first stage, a base integration signal or AD base is generated. In the second stage, a current/present integration signal or AD current is generated. As shown in FIG. 4, a total number of 6 cycles of signal is selected to integrate to calculate the variation of frequency of the signal, wherein two of the six cycles are selected from the signal with a frequency $f_1$ and a current integration period x, and the other four cycles are selected from the signal with a predetermined/fixed frequency $f_0$ and a predetermined signal with a predetermined/fixed integration period y. It will be appreciated for any one with ordinary skill in the art that the number of the cycle/period with the frequency $f_1$ and the predetermined/fixed frequency $f_0$ selected is not limited, and various equivalents or modifications may be used to practice the invention without departing from the scope of the present invention, which is intended to be limited solely by the appended claims. Since the predetermined/fixed integration period y is a fixed period from the predetermined/fixed frequency $f_0$ (375 KHz), the base integration signal or AD base equals the current/present integration signal or AD current if the frequency $f_1$ equals 375 KHz and the current integration period x equals 2/375000 sec, and the predetermined/fixed integration period y equals 4/375000 sec. However, if the frequency $f_1$ equals 372 KHz, since four cycles of signal with the predetermined/fixed frequency $f_0$ (375 KHz) are selected, the integration period will increase due to the variation of the frequency (decreasing frequency or increasing cycle), and the current/present integration signal or AD current will be larger than the base integration signal or AD base so that the variation of frequency $\Delta f$ of the signal can be calculated. Thus in order to calculate a present frequency $f_c$ (or an unknown frequency of the signal after several cycles from the time where the frequency of the signal equals the frequency $f_1$), the number of cycles of the signal with the current/present frequency $f_c$ and the number of cycles of the signal with the predetermined/fixed frequency $f_0$ (such as 375 KHz) are selected respectively. Then the current/present integration signal or AD current and the base integration signal or AD base can be obtained through the integration of the signals. A difference between the current/present integration period and the predetermined/fixed integration period can be calculated through the difference between the current/present integration signal or AD current and the base integration signal or AD base. The period of the signal with the current/present frequency $f_c$ equals to the sum of the period of the signal with the predetermined/fixed frequency (such as 375 KHz) and the difference between the current/present integration period and the predetermined/fixed integration period. Thus the current/present frequency $f_c$ can be obtained.

In the above embodiment, a two-stage method is used to calculate the variation of frequency of the signals. In the first stage, a base integration signal or AD base is generated. In the second stage, a current/present integration signal or AD current is generated. The base integration signal or AD base is obtained from the signal with a frequency $f_1$, while the current/present integration signal or AD current is obtained from the signal with the frequency $f_1$ and the signal with the predetermined/fixed frequency $f_0$. In order to calculate the variation of frequency of the signals, a larger number of cycle of the signal with the predetermined/fixed frequency $f_0$ and a smaller number of cycle of the signal with the frequency $f_1$ are selected to obtain a current/present integration signal. If the frequency $f_1$ is lower than the predetermined/fixed frequency $f_0$, the current/present integration period is longer than the predetermined/fixed integration period and the current/present integration signal is larger than the base integration signal so that the variation of frequency of the signal can be calculated. The sum of the period of the signal with the predetermined/fixed frequency $f_0$ and the difference between the current/present integration period and the predetermined/fixed integration period equals to the period of the signal with the current/present frequency $f_c$, and the current/present frequency $f_c$ can be obtained. Therefore, the variation of frequency and the current/present frequency (or actual frequency at one time) of the signal can be calculated in a relative less number of period/cycle in the embodiment without being affected by phase shift of signal resulting from different hardwares used, and the error of frequency due to the variation of strength of signal can be decreased to a minimum level.

Although specific embodiments have been illustrated and described, it will be appreciated by those skilled in the art that various modifications may be made without departing from the scope of the present invention, which is intended to be limited solely by the appended claims.

What is claimed is:

1. A method for frequency detection and detecting variation of frequency comprising:
    providing a pointer on an electromagnetic position detection apparatus, the pointer emitting a signal with a frequency $f_1$ to the electromagnetic position detection apparatus;
    generating a base integration signal according to a current integration period x and the signal with the frequency $f_1$ by the electromagnetic position detection apparatus;
    generating a current integration signal according to the current integration period x and a predetermined integration period y and a predetermined signal with a Predetermined frequency $f_0$ by the electromagnetic position detection apparatus; and
    calculating a variation of frequency $\Delta f$ between the predetermined frequency $f_0$ and a current frequency $f_c$ according to the base integration signal and the current integration signal by the electromagnetic position detection apparatus, wherein the current frequency $f_c$ is calculated via selecting a number of cycles of the signal with the frequency $f_1$ and a number of cycles of the predetermined signal with the frequency $f_0$.

2. The method according to claim 1, wherein the pointer comprises a batteryless pointer.

3. The method according to claim 1, wherein the predetermined integration period y is larger than the current integration period x.

4. The method according to claim 1, wherein the predetermined integration period y is a multiple of the period of the predetermined signal with the predetermined frequency $f_0$, and the current integration period x is a multiple of the period of the signal with the frequency $f_1$.

5. The method according to claim 1, wherein the predetermined frequency $f_0$ is higher than the frequency $f_1$.

* * * * *